(12) United States Patent
Adrian

(10) Patent No.: US 10,212,846 B2
(45) Date of Patent: Feb. 19, 2019

(54) DATA STORAGE SERVER DRAWER

(71) Applicant: Facebook, Inc., Menlo Park, CA (US)

(72) Inventor: Jason David Adrian, San Jose, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 15/593,168

(22) Filed: May 11, 2017

(65) Prior Publication Data

US 2017/0332507 A1 Nov. 16, 2017

Related U.S. Application Data

(60) Provisional application No. 62/335,324, filed on May 12, 2016.

(51) Int. Cl.
*H05K 7/20* (2006.01)
*G11B 33/12* (2006.01)
*G11B 33/14* (2006.01)
*H05K 7/14* (2006.01)

(52) U.S. Cl.
CPC ....... *H05K 7/20145* (2013.01); *G11B 33/128* (2013.01); *G11B 33/142* (2013.01); *H05K 7/1487* (2013.01); *H05K 7/20727* (2013.01)

(58) Field of Classification Search
CPC .. G06F 1/187; H05K 7/20736; H05K 7/1489; H05K 7/1488; H05K 7/1492; H05K 7/20727; H05K 13/0023; H05K 7/1487; H05K 7/20572; H05K 7/1491; H05K 7/20145; H05K 7/20172; G11B 33/128
See application file for complete search history.

(56) References Cited

U.S. PATENT DOCUMENTS

| | | | | |
|---|---|---|---|---|
| 3,874,444 A * | 4/1975 | Perce | ................. | H05K 7/20545 165/122 |
| 4,624,433 A * | 11/1986 | Henneberg | ............. | F16M 11/10 248/346.06 |
| 5,506,750 A * | 4/1996 | Carteau | ................ | G11B 33/128 361/679.32 |
| 6,512,672 B1 * | 1/2003 | Chen | .................. | H05K 7/20563 165/80.3 |
| 7,259,961 B2 * | 8/2007 | Lucero | ............... | H05K 7/20563 165/121 |
| 7,633,754 B1 * | 12/2009 | Mumper | ............ | H05K 7/20572 361/694 |
| 9,326,416 B1 * | 4/2016 | Xu | ........................ | G11B 33/128 |
| 2009/0021910 A1 * | 1/2009 | Lai | ..................... | H05K 7/20181 361/695 |

\* cited by examiner

*Primary Examiner* — James Wu
(74) *Attorney, Agent, or Firm* — FisherBroyles, LLP

(57) ABSTRACT

Technology is provided for a data storage server drawer. The server drawer includes a drawer chassis having first and second lateral drive bays separated by a central channel. The drawer chassis includes a front wall including one or more air flow openings, a bottom wall having one or more louvers opening toward the front wall, and a pair of sidewalls. A pair of drawer slides are each disposed on a corresponding one of the pair of sidewalls and configured for attachment to a rack. A first plurality of data storage devices is positioned in the first drive bay and a second plurality of data storage devices is positioned in the second drive bay. At least one data server is disposed in the central channel.

15 Claims, 13 Drawing Sheets

DATA STORAGE SERVER DRAWER

CROSS-REFERENCE TO RELATED APPLICATIONS

This application claims priority to and the benefit of U.S. Provisional Application No. 62/335,324, filed May 12, 2016, the disclosure of which is hereby incorporated by reference in its entirety.

TECHNICAL FIELD

This patent application is directed to data storage server configurations and, more specifically, to rack mounted data storage server systems.

BACKGROUND

A data center environment is a collection of computing devices performing various computing functions, e.g., computing, data storage, server applications, databases, etc. Modern data center environments can include one or more data storage servers ("storage servers"). A storage server is a computing device configured to store large amounts of data. As an example, a storage server can have a processor, network interface, and many data storage devices (e.g., hard disk drives, optical drives, solid state drives, etc.).

Some data storage devices are prone to various failures. For example, hard disk drives and optical drives can have various mechanical failures, and solid state drives can have memory failures. Data center operators use various techniques to recover from such failures. One such technique is to store data redundantly, sometimes with error correction codes, in multiple data storage devices. For example, data center operators can use various configurations of redundant arrays of independent disk drives ("RAID") or other recovery techniques. In some configurations of these techniques, storage servers may support "hot swapping," which is the ability to remove a data storage device and insert a replacement data storage device without shutting down the storage server. When a replacement data storage device is detected, the storage server automatically populates the detected data storage device, e.g., with data or error correction codes, so that no data was lost by removing a data storage device.

To minimize "downtime" (the time a particular data storage device is inaccessible to the storage server) and generally to facilitate maintenance and configuration of a storage server, it is desirable to mechanically configure the storage server so that the time required to remove and install a data storage device is reduced. To maximize the amount of data in a particular storage server, it is desirable to densely pack the data storage devices so that the available space is efficiently utilized. Densely packing data storage devices can concentrate the heat from such devices while also restricting air flow passages making it difficult to cool the devices.

BRIEF DESCRIPTION OF THE DRAWINGS

Embodiments of the data storage server systems disclosed herein may be better understood by referring to the following Detailed Description in conjunction with the accompanying drawings, in which like reference numerals indicate identical or functionally similar elements.

Figure 1:
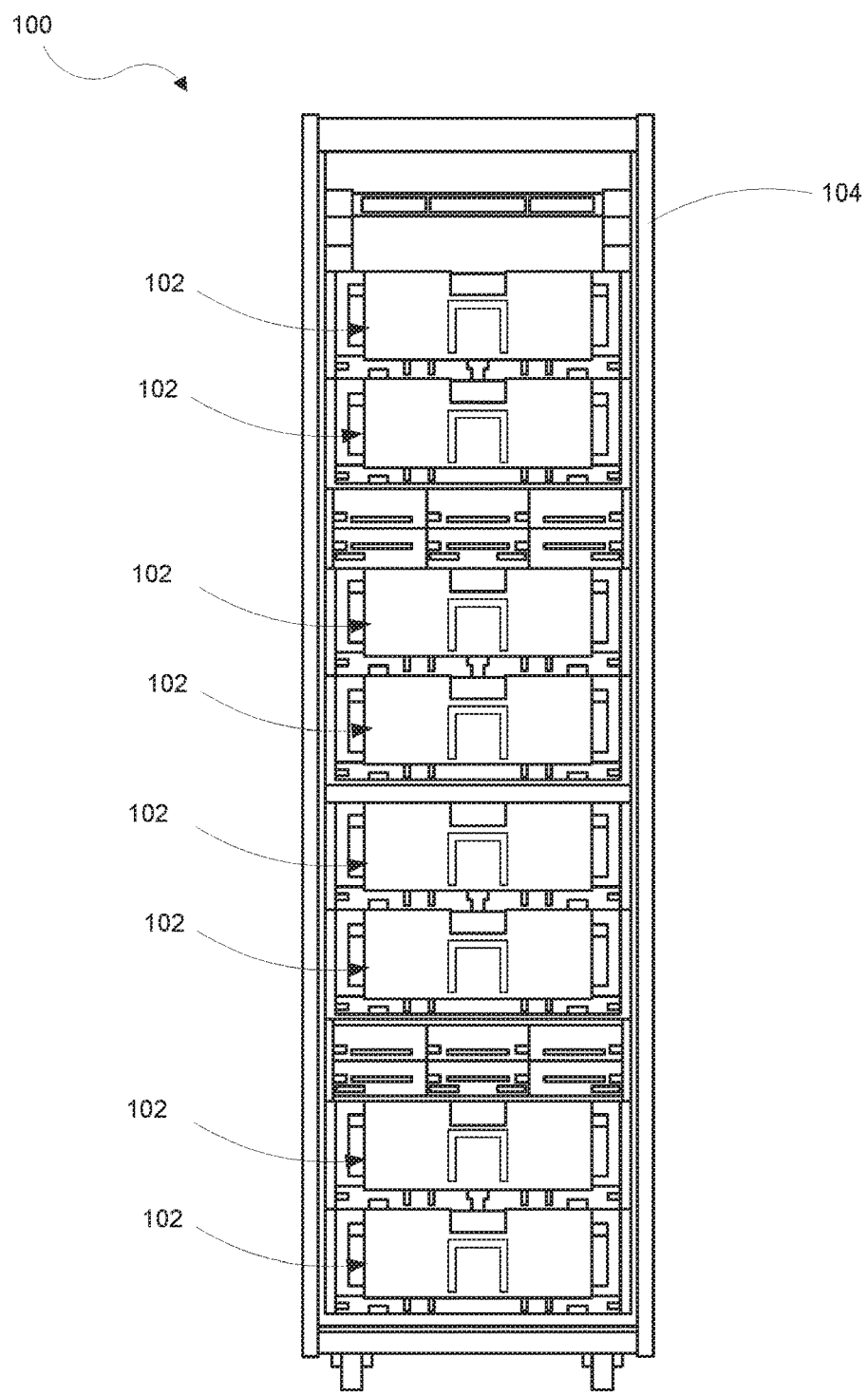
FIG. 1 is a front view in elevation of a rack containing a plurality of data storage server drawers according to a representative embodiment.

The headings provided herein are for convenience only and do not necessarily affect the scope or meaning of the claimed embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to unnecessarily limit the embodiments described. On the contrary, the embodiments are intended to cover all suitable modifications, equivalents, and alternatives falling within the scope of the embodiments as defined by the appended claims.

DETAILED DESCRIPTION

Overview

The storage server disclosed in the attached figures is configured so that the data storage devices are densely packed in a vertical configuration (e.g., orthogonal to a bottom surface of the storage server). A locking lever mechanism is removably attached to the storage server adjacent to each data storage device so that the lever covers the front side when the lever is closed and exposes the front side when the lever is extended. The lever has a connected bottom portion that can be attached to a bottom surface of the storage server. When the lever is opened, it causes the adjacent data storage device to be detached from the server and pushed upwards, thereby disconnecting its electrical contacts. This configuration facilitates rapid removal of the data storage device without use of any tools. When the lever is mechanically closed, the data storage device makes electrical contact via its back side (the side closest to the bottom surface of the storage server). When the lever is mechanically opened, the data storage device is mechanically moved upwards (away from the bottom surface of the storage server) and loses its electrical contact. The electrical contacts can be for a power supply and data communications ports. In some embodiments, a single locking lever is removably attached to each data storage device. In some embodiments, the storage server has a capacity of 72 data storage devices (two columns having 36 data storage devices each, each column having 6 rows of data storage devices).

General Description

Various examples of the devices introduced above will now be described in further detail. The following description provides specific details for a thorough understanding and enabling description of these examples. One skilled in the relevant art will understand, however, that the techniques discussed herein may be practiced without many of these details. Likewise, one skilled in the relevant art will also understand that the technology can include many other features not described in detail herein. Additionally, some well-known structures or functions may not be shown or described in detail below so as to avoid unnecessarily obscuring the relevant description.

The terminology used below is to be interpreted in its broadest reasonable manner, even though it is being used in conjunction with a detailed description of some specific examples of the embodiments. Indeed, some terms may even be emphasized below; however, any terminology intended to be interpreted in any restricted manner will be overtly and specifically defined as such in this section.

Figure 2:
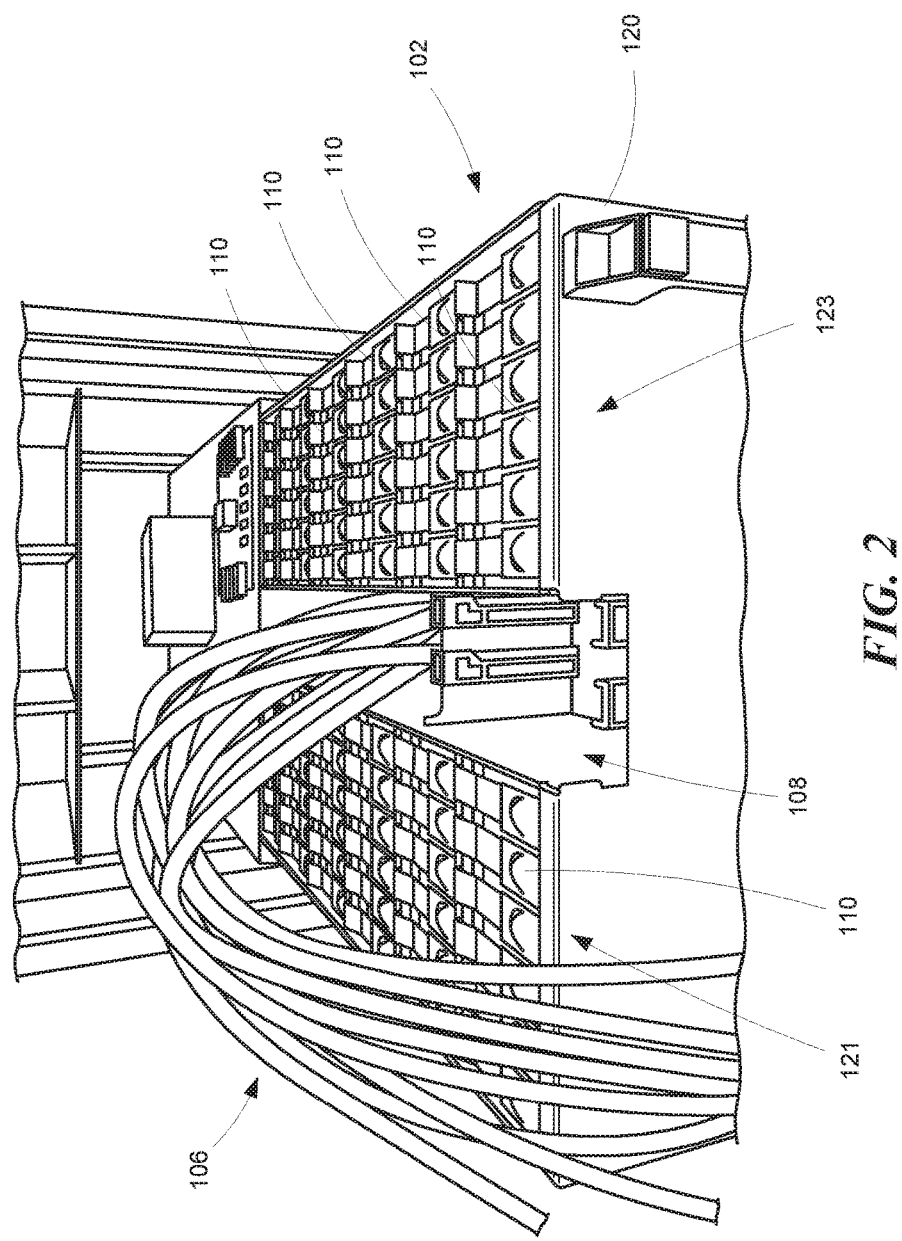
FIG. 2 is a front perspective view of a data storage server drawer according to a representative embodiment.
Figure 3:
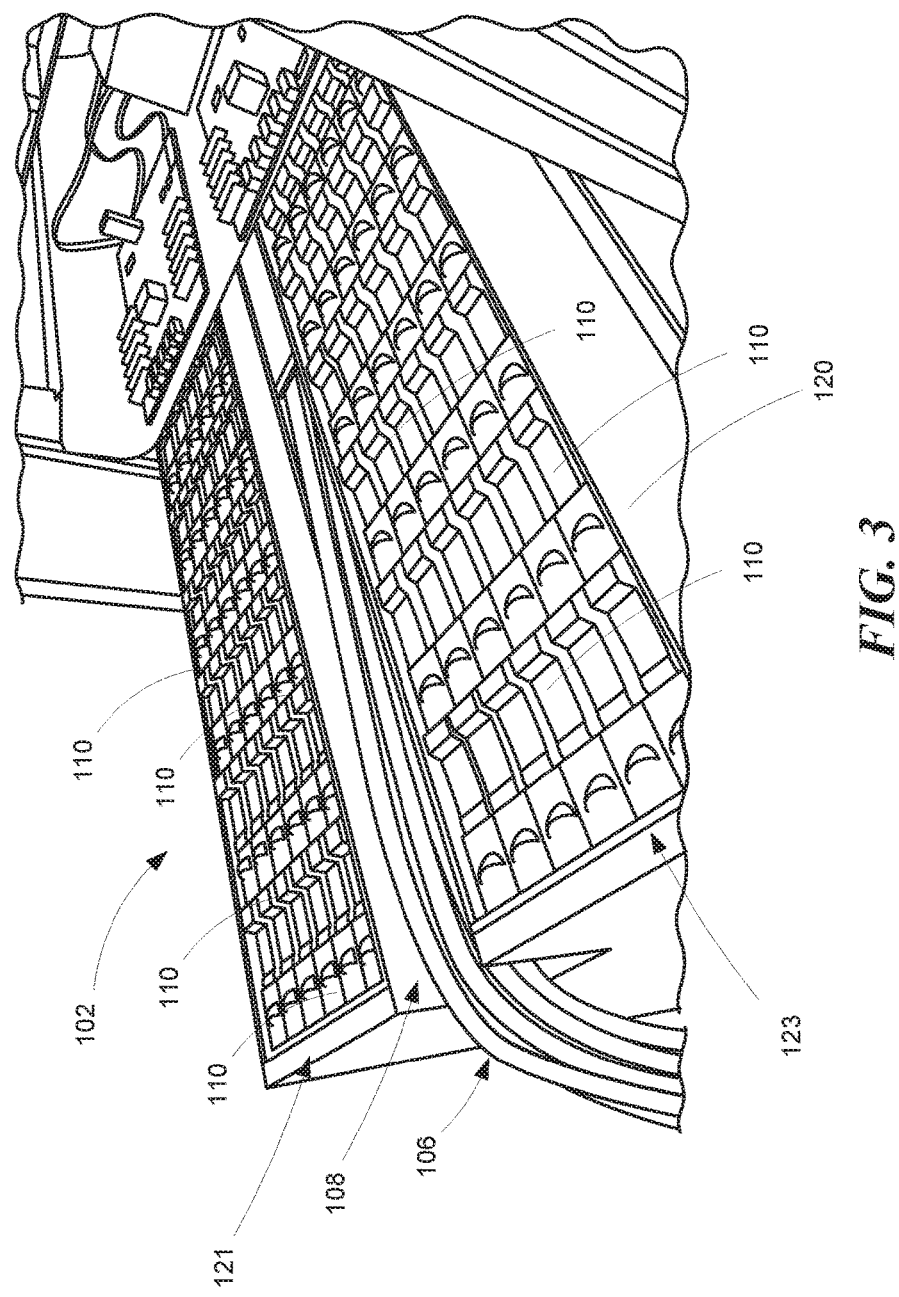
FIG. 3 is a partial perspective side view of the data storage server drawer shown in FIG. 2.

FIG. 1 illustrates a data storage server system 100 according to a representative embodiment. The data storage server system 100 can include a cabinet or a rack 104 containing a plurality of data storage server drawers 102. With further reference to FIGS. 2 and 3, each data storage server drawer 102 can be configured as a sliding enclosure such that the drawer can extend horizontally away from the rack 104 to expose a set of data storage devices 110 installed within the storage server drawer 102. The data storage server drawer 102 can include a drawer chassis 120 having first and second lateral drive bays 121 and 123 separated by a center cavity or central channel 108 for placement of electrical wires 106 (e.g., data communications wires).

Figure 4:
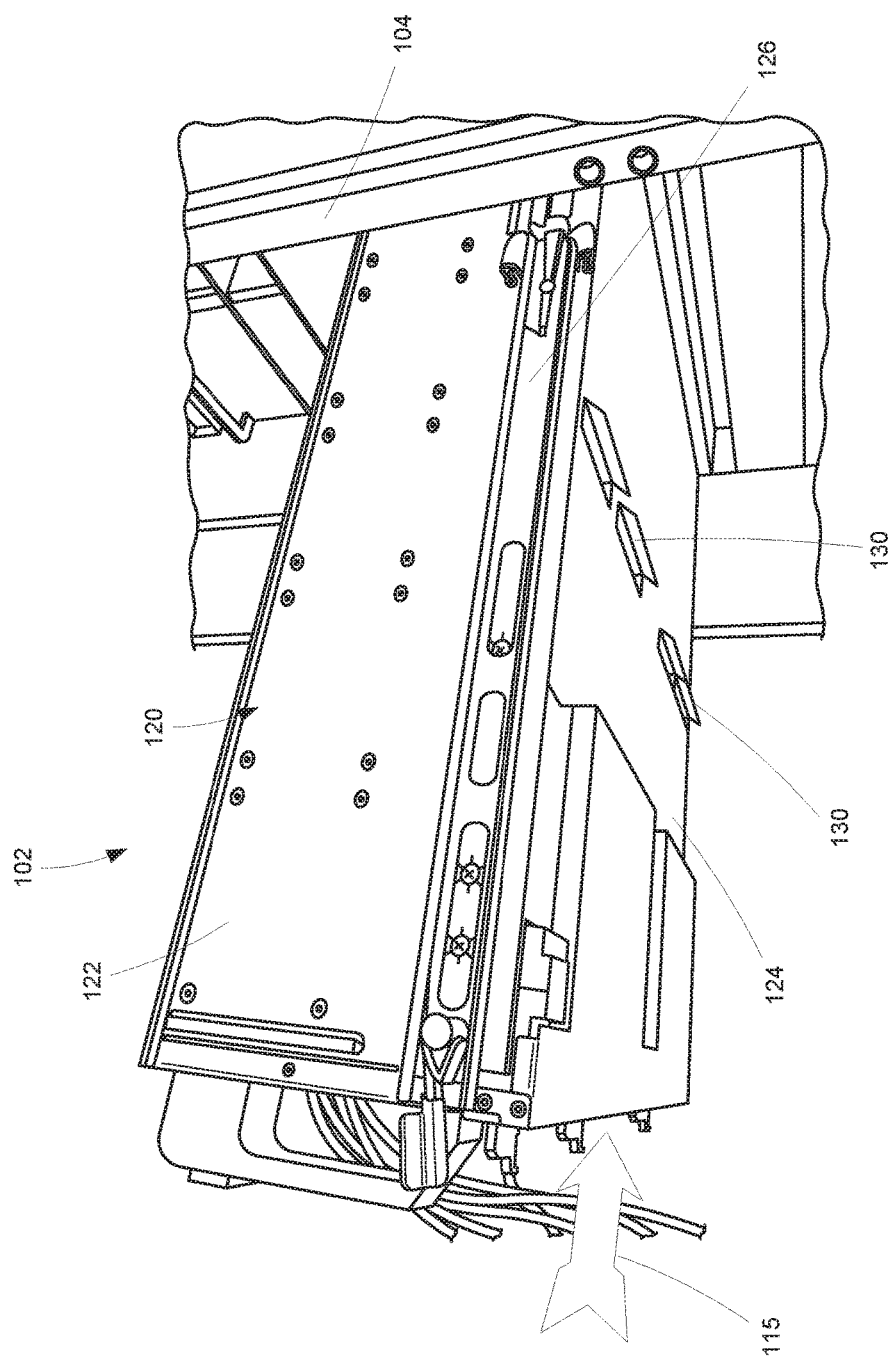
FIG. 4 is a perspective view of the data storage server drawer shown in FIGS. 2 and 3 as viewed from below.

As shown in FIG. 4, the drawer chassis 120 can include a bottom wall 124 and a pair of sidewalls 122. A pair of drawer slides 126 are each disposed on a corresponding one of the pair of sidewalls 122 and configured for attachment to the rack 104. In some embodiments, the bottom wall 124 can include one or more flaps or louvers 130 oriented to open toward the front of the drawer to direct air flow 115 into the drawer chassis 120. In some embodiments, the louvers 130 are positioned approximately in the middle of the bottom wall 124. Positioning the louvers in the middle of the bottom wall 124 directs air flow to the data storage devices 110 in the middle of the data storage server drawer 102, which may otherwise be blocked from receiving cool air by the data storage devices 110 located closer to the front of the drawer. Although a single line of laterally extending louvers 130 is shown in the depicted embodiments, additional louvers can be positioned on the bottom wall 124 as necessary to cool "hot spots" or relatively warm/hot devices within the drawer.

Figure 5:
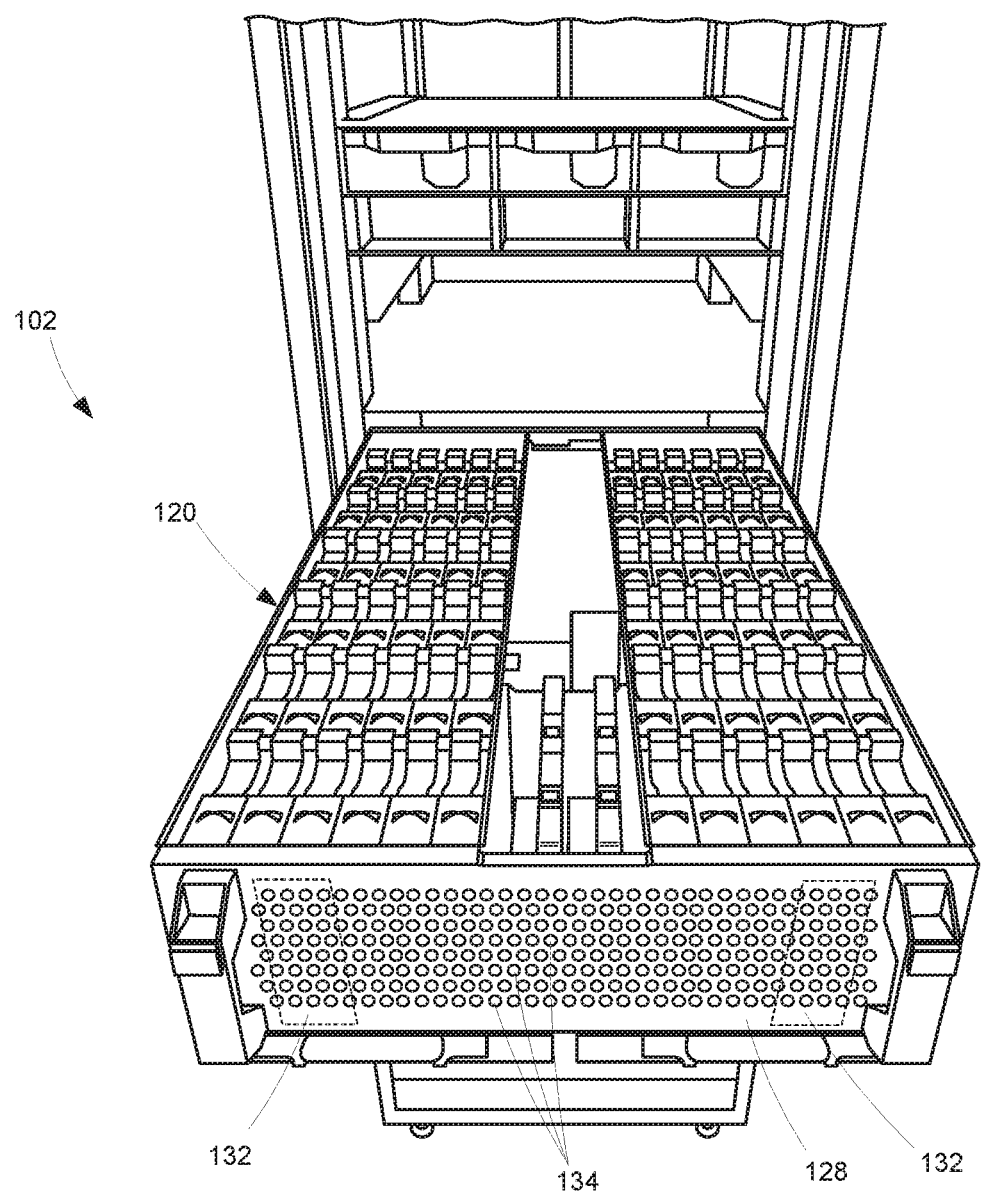
FIG. 5 is a front perspective view of a data storage server drawer including representative air flow control features.

As shown in FIG. 5, the drawer chassis 120 can also include a front wall 128 having one or more air flow openings 134. In some embodiments, the front wall 128 can comprise perforated sheet metal providing the air flow openings 134. The number and size of the air flow openings 134 can be configured to control the amount of air flow entering the front of the drawer chassis 120 as opposed to (or in addition to) the louvers 130 (FIG. 4). In some embodiments, the data storage server drawer 102 can include baffles 132 positioned adjacent the front wall 128 to at least partially block the one or more air flow openings 134 in order to selectively adjust the amount of air flow entering the front of the drawer chassis 120. In one or more embodiments, the baffles 132 can be removable and/or movable relative to the front wall to control the airflow into the drawer chassis 120. Although two baffles 132 are shown in the depicted embodiment, more or fewer baffles of the same or differing sizes and locations along the front wall 128 can be used.

Figure 6:
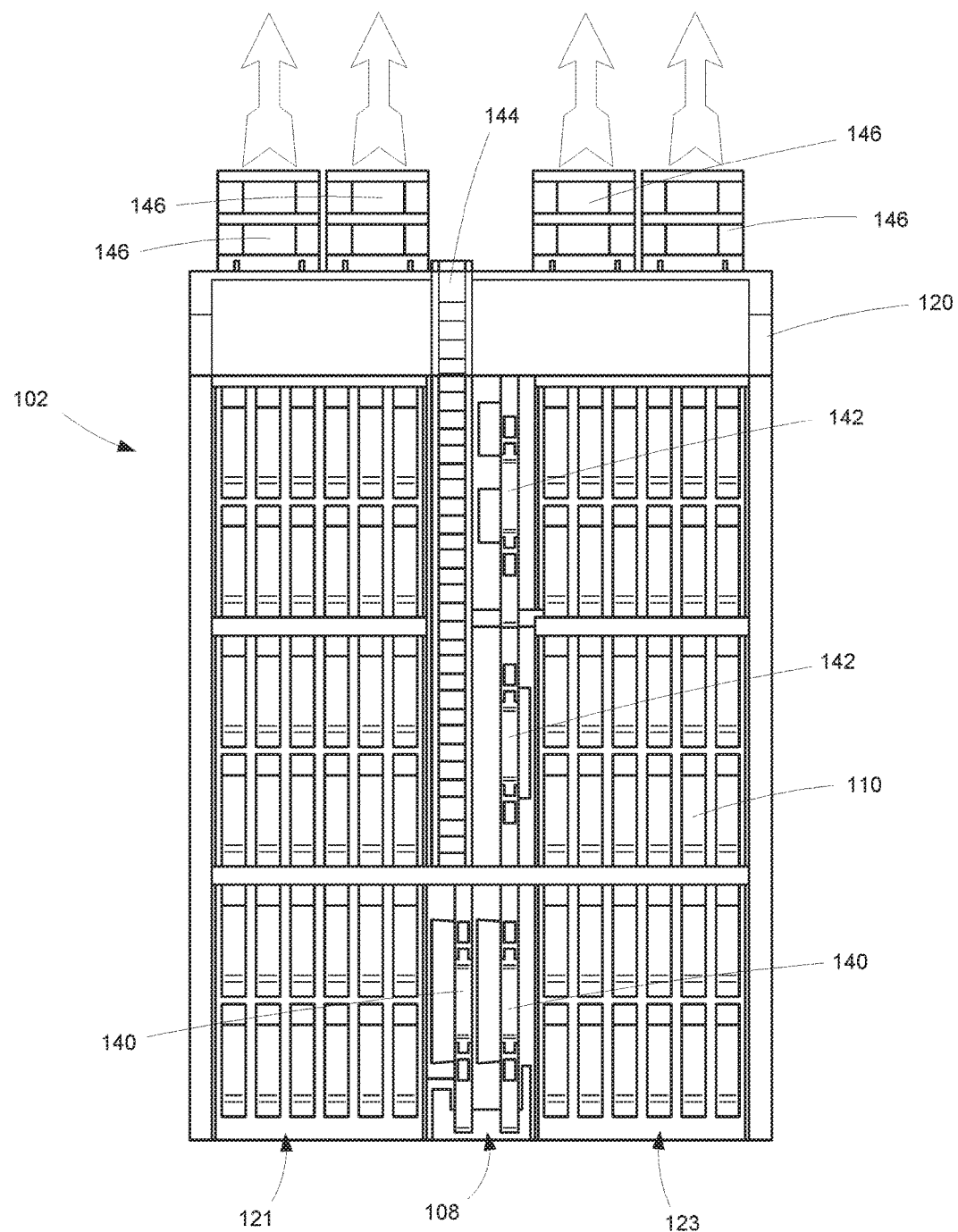
FIG. 6 is a top plan view of the data storage server drawer.

As shown in FIG. 6, the data storage server drawer 102 can include a plurality of fans 146 positioned at the rear of the drawer chassis 120 and operative to draw air through the chassis from front to back, thereby drawing air through the front panel 128 (FIG. 5) and the one or more louvers 130 (FIG. 4). In some embodiments, the data storage server drawer 102 can include a cable track 144 extending along the central channel 108 positioned to receive various cables, such as the electrical wires 106 (FIG. 3).

In some embodiments, the data storage server drawer 102 can include first and second data server cards 140 disposed in the central channel 108, each associated with a corresponding one of the first and second lateral drive bays 121 and 123. The data storage server drawer 102 can also include first and second storage controller cards 142 disposed in the central channel 108, each associated with a corresponding one of the first and second lateral drive bays 121 and 123. In some embodiments, the first and second lateral drive bays 121 and 123 can each contain 36 data storage devices 110 for a total of 72 data storage devices 110 for each data storage server drawer 102.

Figure 7:
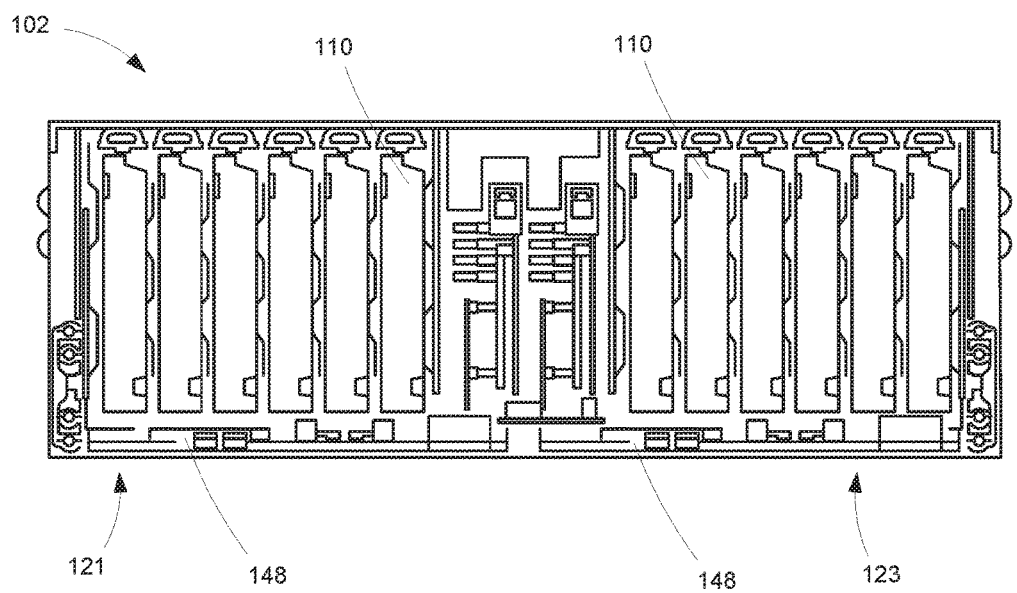
FIG. 7 is an end view of the data storage server drawer.

With further reference to FIG. 7, the data storage server drawer 102 can include first and second personality modules 148, each associated with a corresponding one of the first and second lateral drive bays 121 and 123. A personality module can provide various functionalities that a storage server can be configured to provide (e.g., different data communications ports or standards) to adapt to the data center environment in which the storage server is to operate.

Figure 8:
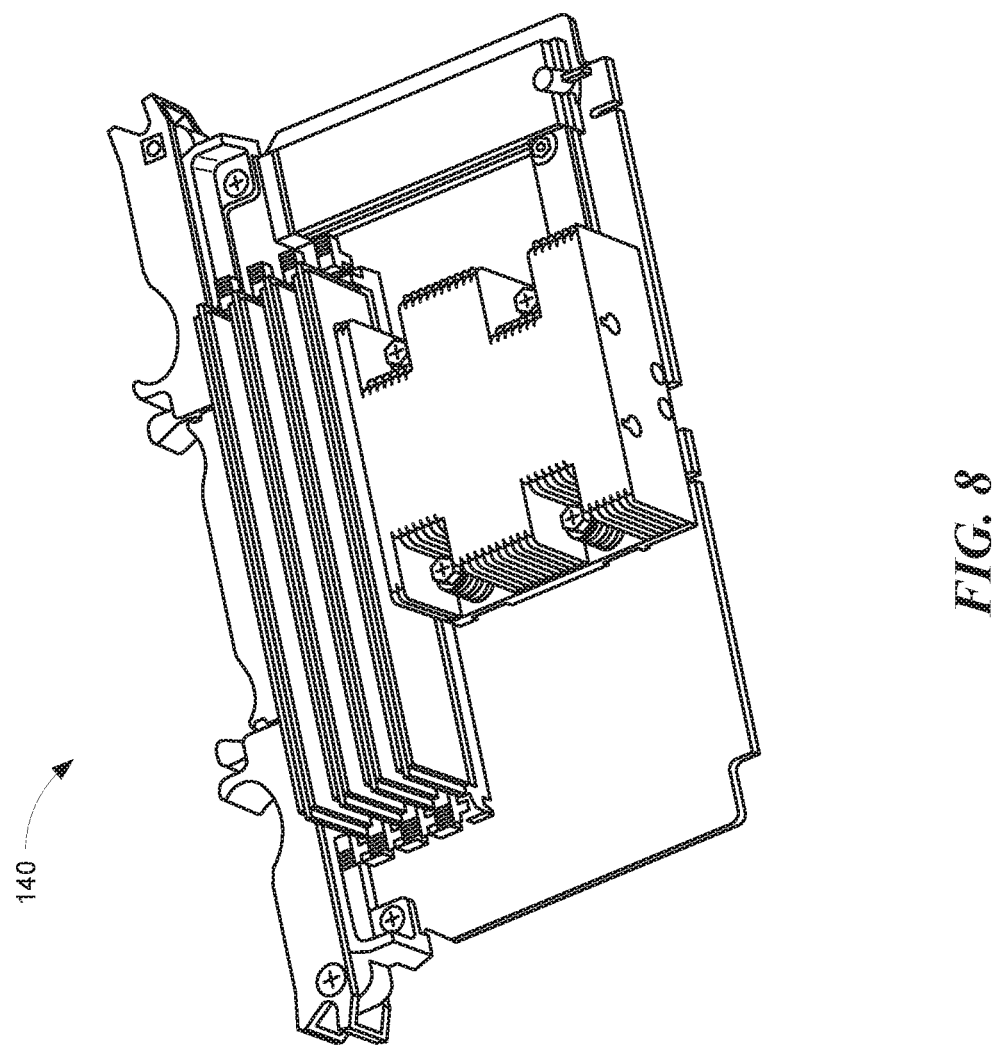
FIG. 8 is an isometric view of a representative server card.
Figure 9:
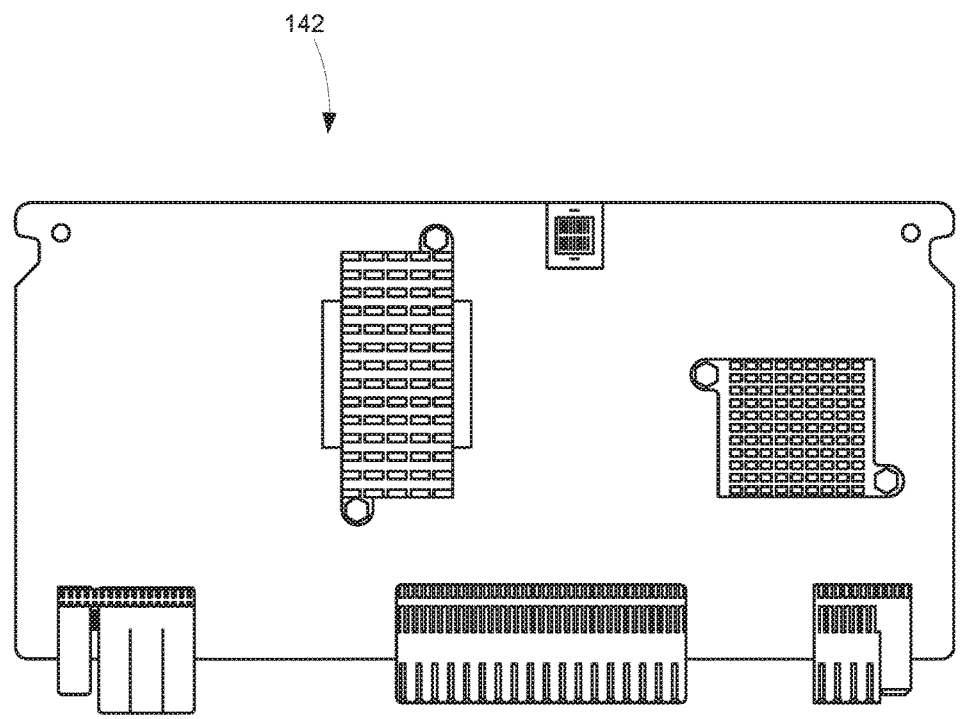
FIG. 9 is a side view of a representative storage controller card.
Figure 10:
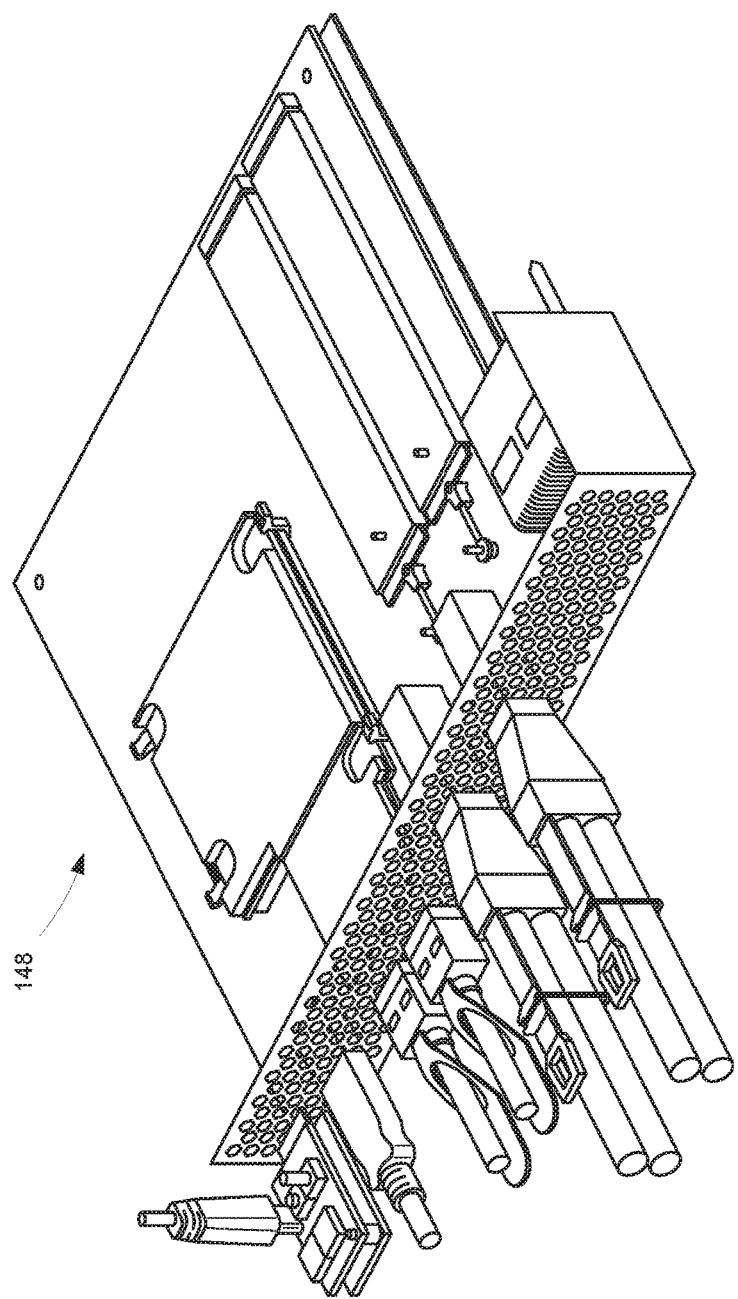
FIG. 10 is an isometric view of a representative personality module.
Figure 11:
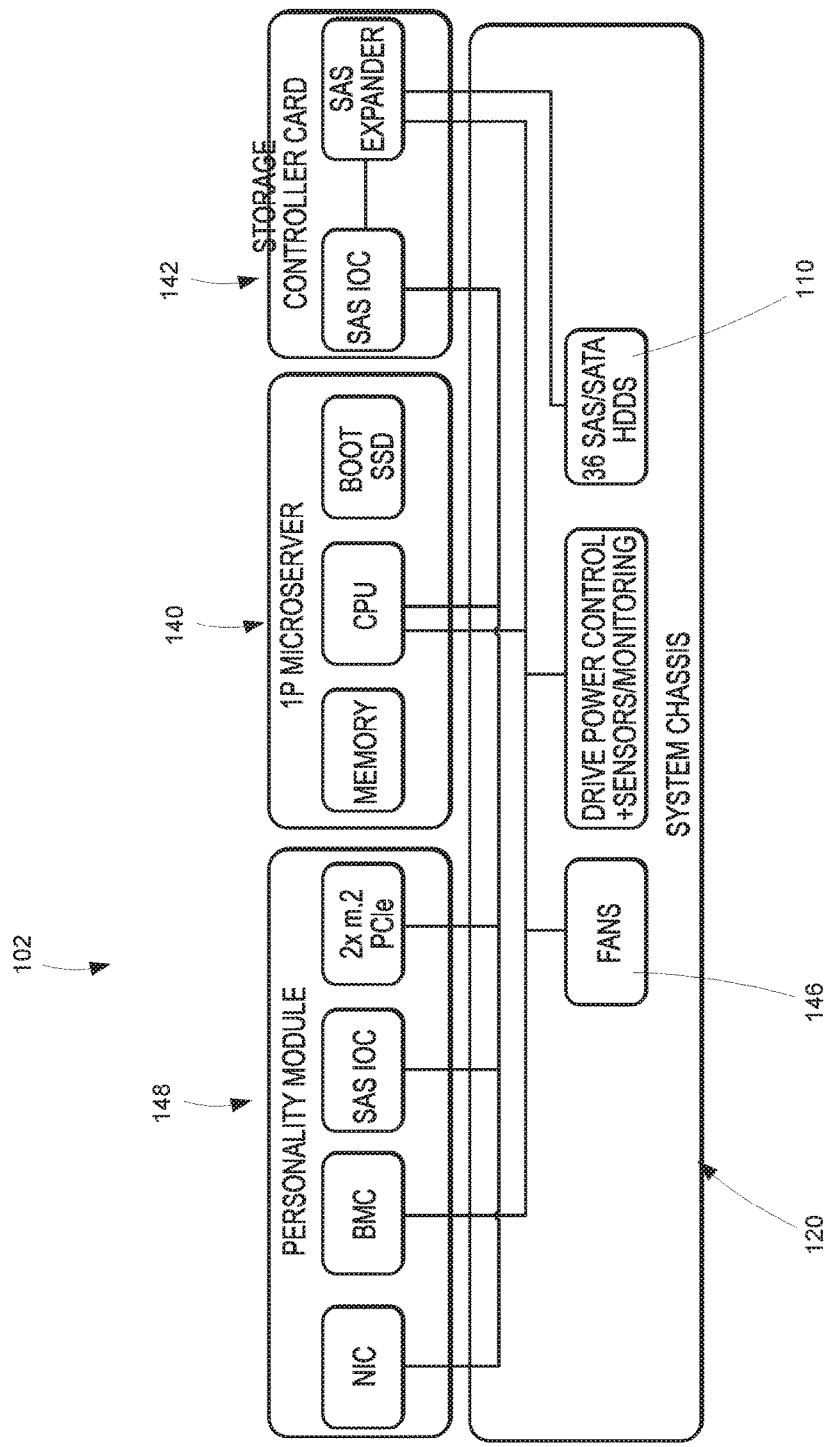
FIG. 11 is a schematic representation of the data storage server drawer architecture.

FIGS. 8-10 illustrate a representative data server card 140, storage controller card 142, and personality module 148, respectively. FIG. 11 schematically illustrates a representative system architecture, including a data server card 140, a storage controller card 142, and a personality module 148, for one of the drive bays 121/123.

Figure 12:
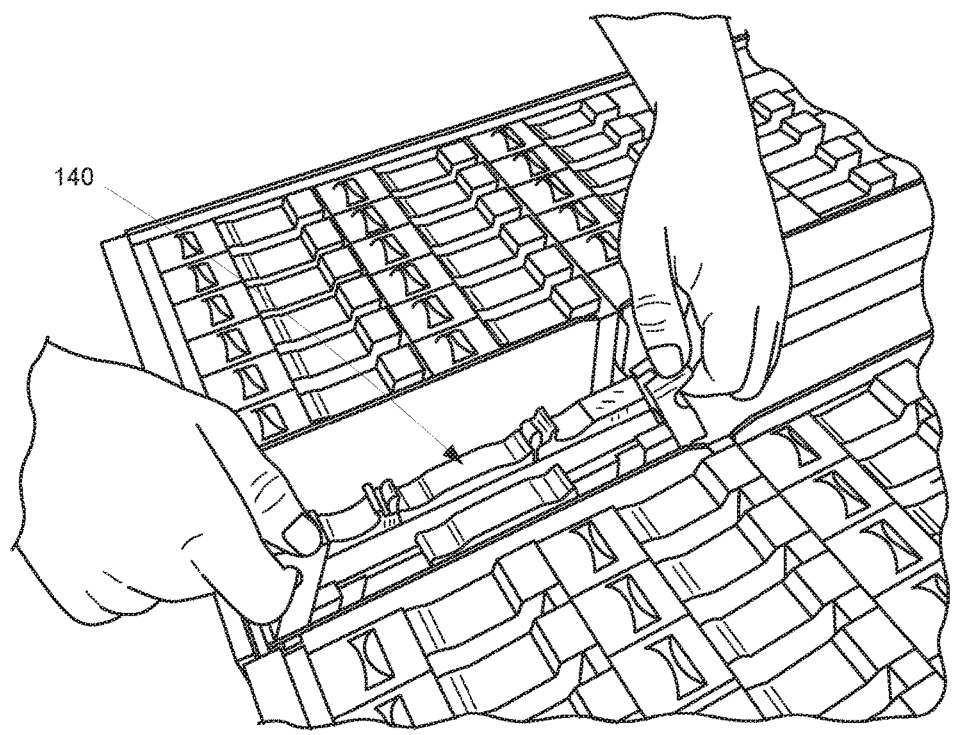
FIG. 12 is a partial perspective view illustrating the removal of a server card from the data storage server drawer.
Figure 13:
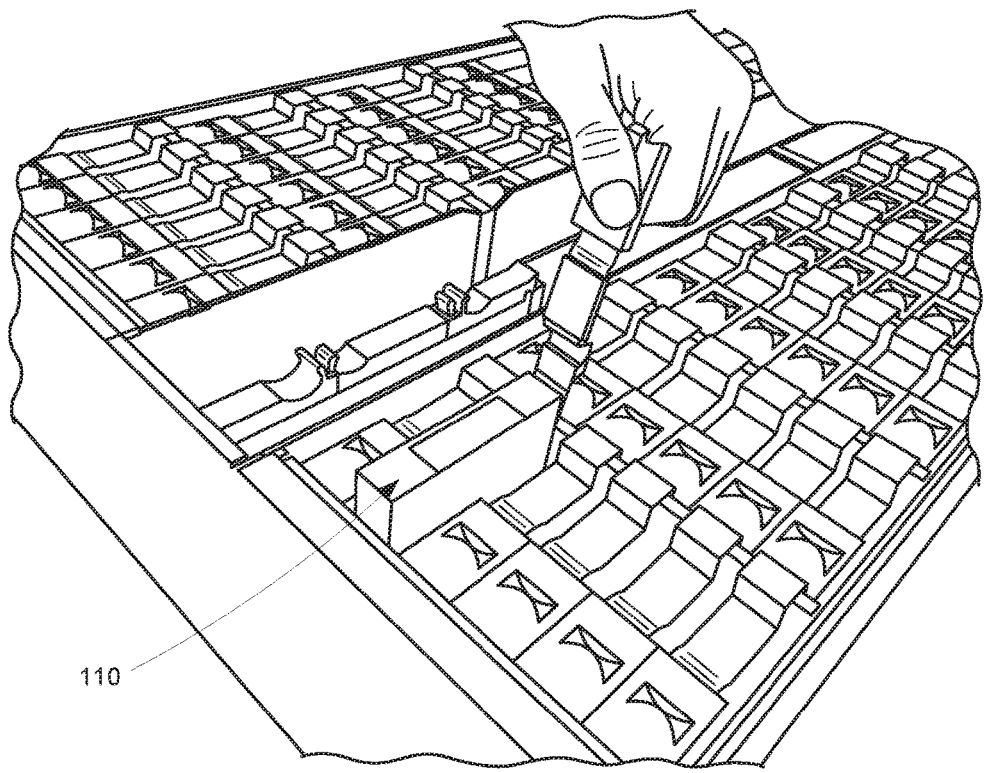
FIG. 13 is a partial perspective view illustrating the removal of a memory device from the data storage server drawer.

As shown in FIG. 12, the data server cards 140 can be removed and replaced by unlatching the card from the chassis and pulling it vertically from the drawer chassis. The storage controller cards 142 can be replaced in a similar fashion. FIG. 13 illustrates removal of a data storage device 110, which is also unlatched and removed vertically. It should be appreciated that the data storage server drawer 102 components are easily removed and replaced by extending the drawer horizontally from the rack, thereby exposing the components (e.g., data storage devices 110, data server cards 140, storage controller cards 142, and personality modules 148) and cables for easy access.

These and other embodiments would be recognized by one having ordinary skill in the art as an improvement over the known prior art. Although some components are illustrated and discussed, one having ordinary skill in the art would recognize that other components that are neither illustrated nor discussed, but generally known in the data storage server technology, would be employable.

Remarks

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments. Accordingly, the embodiments are not limited except as by the appended claims.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term. Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

What is claimed is:

1. A data storage server drawer, comprising:
    a drawer chassis, including:
        a front wall;
        a bottom wall having one or more louvers opening toward the front wall; and
        a pair of sidewalls;
    a pair of drawer slides each disposed on a corresponding one of the pair of sidewalls and configured for attachment to a rack;
    a plurality of data storage devices positioned in the drawer chassis;
    a data server card disposed in the drawer chassis and associated with a first subset of the plurality of data storage devices; and
    a storage controller card disposed in the drawer chassis and associated with the first subset of the plurality of data storage devices.

2. The data storage server drawer of claim 1, wherein the one or more louvers are positioned approximately in the middle of the bottom wall.

3. The data storage server drawer of claim 1, wherein the front wall includes one or more air flow openings and further comprising at least one removable baffle positioned adjacent the front wall to at least partially block the one or more air flow openings.

4. The data storage server drawer of claim 1, further comprising at least one data server and at least one storage controller disposed in the drawer chassis.

5. The data storage server drawer of claim 1, further comprising a plurality of fans positioned on the drawer chassis and operative to draw air through the one or more louvers.

6. A data storage server drawer, comprising:
    a drawer chassis having first and second lateral drive bays separated by a central channel, the drawer chassis including:
        a front wall including one or more air flow openings;
        a bottom wall having one or more louvers opening toward the front wall; and
        a pair of sidewalls;
    a pair of drawer slides each disposed on a corresponding one of the pair of sidewalls and configured for attachment to a rack;
    a first plurality of data storage devices positioned in the first drive bay;
    a second plurality of data storage devices positioned in the second drive bay;
    at least one data server card disposed in the central channel and associated with one of the first and second lateral drive bays; and
    at least one storage controller card disposed in the central channel and associated with the one of the first and second lateral drive bays.

7. The data storage server drawer of claim 6, wherein the one or more louvers are positioned approximately in the middle of the bottom wall.

8. The data storage server drawer of claim 6, further comprising at least one removable baffle positioned adjacent the front wall to at least partially block the one or more air flow openings.

9. The data storage server drawer of claim 6, further comprising at least one storage controller disposed in the central channel.

10. The data storage server drawer of claim 6, further comprising a plurality of fans positioned on the drawer chassis and operative to draw air through the one or more air flow openings and the one or more louvers.

11. A data storage server drawer, comprising:
    a drawer chassis having first and second lateral drive bays separated by a central channel, the drawer chassis including:
        a front wall including one or more air flow openings;
        a bottom wall having one or more louvers positioned approximately in the middle of the bottom wall and opening toward the front wall; and
        a pair of sidewalls;
    a pair of drawer slides each disposed on a corresponding one of the pair of sidewalls and configured for attachment to a rack;
    a first plurality of data storage devices positioned in the first drive bay;
    a second plurality of data storage devices positioned in the second drive bay;
    first and second data server cards disposed in the central channel each associated with a corresponding one of the first and second lateral drive bays;
    first and second storage controller cards disposed in the central channel each associated with a corresponding one of the first and second lateral drive bays; and
    at least one removable baffle positioned adjacent the front wall to at least partially block the one or more air flow openings.

12. The data storage server drawer of claim 11, further comprising first and second personality modules each associated with a corresponding one of the first and second lateral drive bays.

13. The data storage server drawer of claim 11, wherein the first and second plurality of data storage devices each comprise 36 data storage devices.

14. The data storage server drawer of claim 11, further comprising a plurality of fans positioned on the drawer chassis and operative to draw air through one or more air flow openings and the one or more louvers.

15. The data storage server drawer of claim 11, further comprising a cable track extending along the central channel positioned to receive server cables therethrough.

* * * * *